US007869280B2

(12) United States Patent
Kosaki et al.

(10) Patent No.: US 7,869,280 B2
(45) Date of Patent: *Jan. 11, 2011

(54) SEMICONDUCTOR MEMORY DEVICE REALIZING A CHANNEL VOLTAGE CONTROL SCHEME ADOPTING DUMMY CELLS WITH THRESHOLD VOLTAGE HIGHER THAN THRESHOLD VOLTAGE OF ERASED MEMORY CELLS AND METHOD THEREOF

(75) Inventors: Yasukazu Kosaki, Kamakura (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 439 days.

This patent is subject to a terminal disclaimer.

(21) Appl. No.: 11/862,539

(22) Filed: Sep. 27, 2007

(65) Prior Publication Data
US 2008/0239822 A1    Oct. 2, 2008

(30) Foreign Application Priority Data
Sep. 28, 2006    (JP)    ............................. 2006-264935

(51) Int. Cl.
*G11C 16/10*    (2006.01)
(52) U.S. Cl. .............................. 365/185.2; 365/185.17; 365/185.28; 365/185.02; 365/185.03; 365/185.12; 365/185.11
(58) Field of Classification Search ............ 365/185.17, 365/185.28, 185.29, 185.2, 185.02, 185.03, 365/185.12, 185.11, 185.05
See application file for complete search history.

(56) References Cited

U.S. PATENT DOCUMENTS

| 6,859,395 | B2 | 2/2005 | Matsunaga et al. |
| 7,079,437 | B2 | 7/2006 | Hazama et al. |
| 7,630,251 | B2 * | 12/2009 | Hosono .................... 365/185.2 |
| 2004/0105308 | A1 * | 6/2004 | Matsunaga et al. ..... 365/185.11 |
| 2008/0137409 | A1 * | 6/2008 | Nakamura et al. ........ 365/185.2 |
| 2008/0137422 | A1 * | 6/2008 | Hosono .................. 365/185.17 |

FOREIGN PATENT DOCUMENTS

JP    2004127346 A    *    4/2004

OTHER PUBLICATIONS

Jae-Duk Lee, et al., "A New Programming Disturbance Phenomenon in Nand Flash Memory by Source/Drain Hot-Electrons Generated by GIDL Current", IEEE, Feb. 14, 2006, pp. 31-33.

* cited by examiner

*Primary Examiner*—Andrew Q Tran
(74) *Attorney, Agent, or Firm*—Oblon, Spivak, McClelland, Maier & Neustadt, L.L.P.

(57) ABSTRACT

A semiconductor memory device with NAND cell units arranged therein, the NAND cell unit including: a plurality of electrically rewritable and non-volatile memory cells connected in series; first and second select gate transistors disposed at the both ends of the NAND cell unit for coupling it to a bit line and a source line, respectively; and dummy cells disposed adjacent to the first and second select gate transistors in the NAND cell unit, wherein the dummy cells are set at a state with a threshold voltage higher than that of an erase state of the memory cell.

18 Claims, 16 Drawing Sheets

FIG. 11
Before Erase
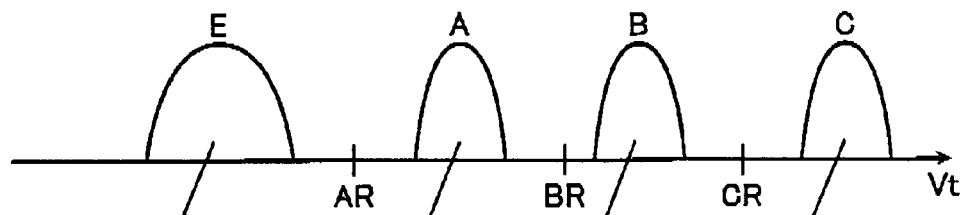
After Erase
After Soft PGM
WL0~63
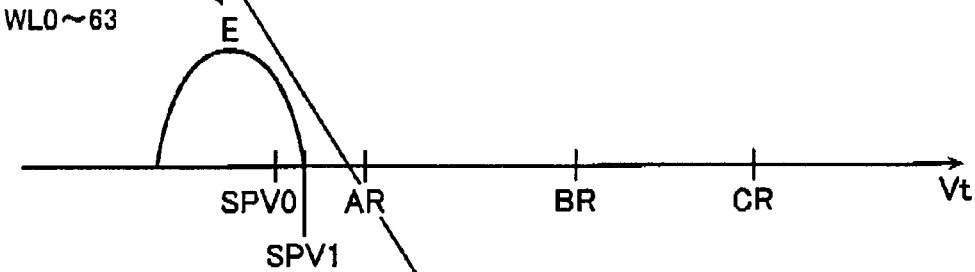
WLDS/WLDD
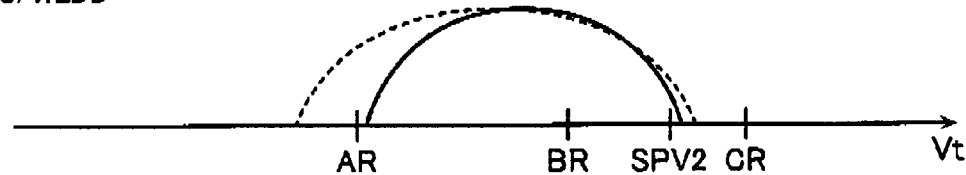

FIG. 18

| | SB | EASB(1) | EASB(2) | LSB(1) | LSB(2) | SB(WL0) |
|---|---|---|---|---|---|---|
| SGD | Vsgd | Vsgd | Vsgd | Vsgd | Vsgd | Vsgd |
| WLDD | Vpass(L) | Vpass(L) | Vpass(L) | Vpass(L) | Vpass(L) | Vpass(L) |
| WL63 | Vpass(L) | Vpass(L) | Vpass(L) | Vpass(L) | Vpass(L) | Vpass(L) |
| ...... | Vpass(L) | Vpass(L) | Vpass(L) | Vpass(L) | Vpass(L) | Vpass(L) |
| WLn+2 | Vpass(L) | Vpass(L) | Vpass(L) | Vpass(L) | Vpass(L) | Vpass(L) |
| WLn+2 | VpassL | VpassL | VpassL | Viso/Vgp | Viso/Vgp | Vpass(L) |
| WLn+1 | Vpgm | Vpgm | Vpgm | Vgp | Vpgm | Vpass(L) |
| WLn | VpassL | Vpass L | VpassL | Vpgm | Vpass L | Vpass |
| WLn−1 | | Vgp | Vgp | Vgp | Vgp | Vpgm |
| WLn−2 | Vpass(L) | Viso/Vgp | Viso/Vgp | Viso/Vgp | Viso/Vgp | Vpass(L) |
| WLn−3 | Vpass(L) | Vpass(L) | Vpass(L) | Vpass(L) | Vpass(L) | Vpass(L) |
| WLn−4 | Vpass(L) | Vpass(L) | Vpass(L) | Vpass(L) | Vpass(L) | Vpass(L) |
| ...... | Vpass(L) | Vpass(L) | Vpass(L) | Vpass(L) | Vpass(L) | Vpass(L) |
| WL0 | Vpass(L) | Vpass(L) | Vpass(L) | Vpass(L) | Vpass(L) | Vpass(L) |
| WLDS | Vpass(L) | Vpass(L) | Vpass(L) | Vpass(L) | Vpass(L) | Vpass(L) |
| SGS | 0V | 0V | 0V | 0V | 0V | 0V |

SEMICONDUCTOR MEMORY DEVICE REALIZING A CHANNEL VOLTAGE CONTROL SCHEME ADOPTING DUMMY CELLS WITH THRESHOLD VOLTAGE HIGHER THAN THRESHOLD VOLTAGE OF ERASED MEMORY CELLS AND METHOD THEREOF

CROSS-REFERENCE TO RELATED APPLICATION

This application is based on and claims the benefit of priority from the prior Japanese Patent Application No. 2006-264935, filed on Sep. 28, 2006, the entire contents of which are incorporated herein by reference.

BACKGROUND OF THE INVENTION

1. Field of the Invention

This invention relates to a semiconductor memory device with electrically rewritable and non-volatile memory cells, i.e., EEPROM, and specifically to a technology for reducing the write error rate of a NAND-type flash memory.

2. Description of the Related Art

A NAND-type flash memory is known as high integrality one in electrically rewritable and non-volatile semiconductor memories (EEPROMs). In the NAND-type flash memory, a plurality of memory cells are connected in series in such a manner that adjacent two memory cells share a source/drain diffusion layer to constitute a NAND cell unit. The both ends of the NAND cell unit are coupled to a bit line and a source line via select gate transistors, respectively. With such the NAND cell unit structure, the NAND-type flash may be formed to have a smaller unit cell area than that of a NOR-type flash memory, and have a large capacity.

A memory cell in the NAND-type flash memory has a floating gate (i.e., charge storage layer) formed above a semiconductor substrate with a tunnel insulating film interposed therebetween and a control gate stacked above the floating gate with a gate insulating film interposed therebetween so as to store data in a non-volatile manner defined by a charge storage state in the floating gate. Explaining in detail, binary data storage will be defined as follows: an electron-injected state of the floating gate, i.e., a high threshold voltage state, is referred to as, for example, data "0" while an electron-discharged state of the floating gate, i.e., a low threshold state, is referred to as data "1". Recently, multi-level data storage schemes such as four-level data storage schemes tend to be adapted to the NAND-type flash memory by sub-dividing the threshold distributions.

Data write in the NAND-type flash memory is performed page by page where a page is defined by a set of memory cells arranged along a selected word line (or a half thereof). Explaining in detail, data write is performed to inject electrons into the floating gate from the cell channel by FN tunneling with applying write voltage Vpgm to a selected word line. In this case, a NAND cell channel will be controlled in potential in accordance with write data "1" or "0" applied to the cell channel via to a selected bit line. This will be explained as follows.

In case of "0" write, Vss is applied to a bit line, and it is transferred to a selected cell's channel via a turned on select gate transistor. At this time, a large electric field is applied between the floating gate and the channel in the selected cell, so that electrons are injected into the floating gate. By contrast, in case of "1" write, Vdd is applied to a bit line. Therefore, the NAND cell channel is charged up to Vdd-Vth (Vth is threshold voltage of the select gate transistor) to be set in a floating state. At this time, the selected cell's channel is boosted by capacitive coupling from a selected word line, and electron injection into the floating gate will be inhibited.

If the cell channel boost is not sufficient in a "1" write cell (i.e., write-inhibited cell) with Vpgm applied, electron injection into the floating gate occurs, and it leads to an undesirable threshold voltage change. Non-selected word lines are usually applied with a write pass voltage Vpass set to be lower than the write voltage Vpgm, so that a "1" write cell's channel is boosted and electron injection into the floating gate is inhibited. If, in these non-selected cells, the cell channel boost is insufficient, erroneous writes often occur.

Conventionally, there have been provided some channel voltage control schemes used in a write or program mode, which are able to prevent "1" write cells and non-selected cells in a NAND-type flash memory from being erroneously written, as follows (refer to, for example, JP-A-2004-185690).

(1) Self-Boost (SB) scheme: at a "1" write time, all channels in a NAND cell unit are set in a floating state to be boosted by capacitive coupling from a selected word line with Vpgm applied. Except the selected word line, all non-selected word lines are applied with a write pass voltage Vpass lower than Vpgm.

(2) Local Self-Boost (LSB) scheme: at a "1" write time, a selected cell's channel is isolated from others to be boosted. This is on the assumption that memory cells in a NAND cell unit are sequentially written from one on the source line side. Two non-selected word lines disposed adjacent to a selected word line are applied with a channel isolating voltage Viso (<Vpass); and the remaining non-selected word lines with a medium voltage (pass voltage) Vpass.

(3) Erase Area Self-Boost (EASB) scheme: at a "1" write time, written cells' channel area and unwritten cells' channel area including a selected cell are isolated from each other and boosted independently. This also is on the assumption that memory cells in a NAND cell unit are sequentially written from one on the source line side. A non-selected word line, which is located on the source line side of a selected word line and adjacent to it, is applied with channel isolating voltage Viso sufficiently lower than Vpass, so that two channel areas are isolated from each other and boosted.

Even if either one of these channel voltage control schemes is adapted, in case miniaturization of a NAND-type flash memory is further enhanced, such a matter remains to be solved that erroneous write occurs in non-selected cells adjacent to select gate transistors (specifically the source line side select gate transistor). At a data write time, the source line side select gate transistor is kept off with gate voltage 0V. Therefore, when the non-selected cell adjacent to the select gate transistor is applied with pass voltage Vpass, gate-induced drain leakage (GIDL) current is generated at the drain edge of the select gate transistor, and such an erroneous write occurs in the non-selected cell that electrons are injected into the floating gate due to the GIDL current (refer to, for example, Jae-Duk Lee et al, "A NEW PROGRAMMING DISTURBANCE IN NAND FLASH MEMORY BY SOURCE/DRAIN HOT-ELECTRONS GENERATED BY GIDL CURRENT", NVSMW 2006, p. 31-33). It is known that the same erroneous write occurs in the non-selected cell adjacent to the bit line side select gate transistor as above-described case.

The above-described error write stress in the cells adjacent to the select gate transistors will also be generated in such a case that these cells are "1" write cells with Vpgm applied. However, write stress applied to the "1" write cell is only once when a corresponding page is selected. By contrast, error write stress to the adjacent non-selected cell with write pass voltage Vpass applied will be applied in all cases that other pages are selected in the same NAND cell block. Therefore, the error write stress due to the write pass voltage Vpass becomes a matter.

To suppress the erroneous write due to GIDL current, it may be effective somewhat to dispose a dummy cell adjacent to the select gate transistor, which does not serve for storing data. The above-described dummy cell scheme has been provided as such a technology that reduces the position dependence of write/erase property of memory cells to equalize data states in the NAND cell unit (for example, refer to JP-A-2004-127346).

However, even if the above-described dummy cell scheme is adapted, in a further miniaturized NAND-type flash memory with a design rule such as 60 nm or less, the erroneous write due to GIDL current remains a matter.

SUMMARY OF THE INVENTION

According to an aspect of the present invention, there is provided a semiconductor memory device with NAND cell units arranged therein, the NAND cell unit including:

A semiconductor memory device with NAND cell units arranged therein, the NAND cell unit including:

a plurality of electrically rewritable and non-volatile memory cells connected in series;

a first select gate transistor disposed at one end of the NAND cell unit for coupling it to a bit line;

a second select gate transistor disposed at the other end of the NAND cell unit for coupling it to a source line; and dummy cells disposed adjacent to the first and second select gate transistors in the NAND cell unit, wherein the dummy cells are set at a state with a threshold voltage higher than that of an erase state of the memory cell.

According to another aspect of the present invention, there is provided a method for controlling a semiconductor memory device with a NAND cell unit prior to data programming, the NAND cell unit having dummy cells disposed between serially-connected memory cells and select gate transistors on the both ends of the NAND cell unit, including:

erasing the memory cells and the dummy cells in the NAND cell unit prior to data programming;

soft programming the memory cells and the dummy cells to set them in such an erase state that an over-erase state has been dissolved; and programming the dummy cells to set them in a state with a threshold voltage higher than that of the erase state of the memory cells.

According to still another aspect of the present invention, there is provided a method for controlling data in a semiconductor memory device with a NAND cell unit prior to data programming, the NAND cell unit having dummy cells disposed between serially-connected memory cells and select gate transistors on the both ends of the NAND cell unit, including:

erasing the memory cells and the dummy cells in the NAND cell unit prior to data programming; and soft programming the memory cells and dummy cells to dissolve an over-erase state, and to set the memory cells to be in an erase state with a first threshold voltage and the dummy cells to be in a state with a second threshold voltage higher than the first threshold voltage.

BRIEF DESCRIPTION OF THE DRAWINGS

FIG. 11 shows the data transition in accordance with the second erase algorism.

FIG. 18 shows voltage application conditions of word lines and dummy word lines at a write time including other channel boost schemes.

DETAILED DESCRIPTION OF THE EMBODIMENTS

Illustrative embodiments of this invention will be explained with reference to the accompanying drawings below.

Figure 1:
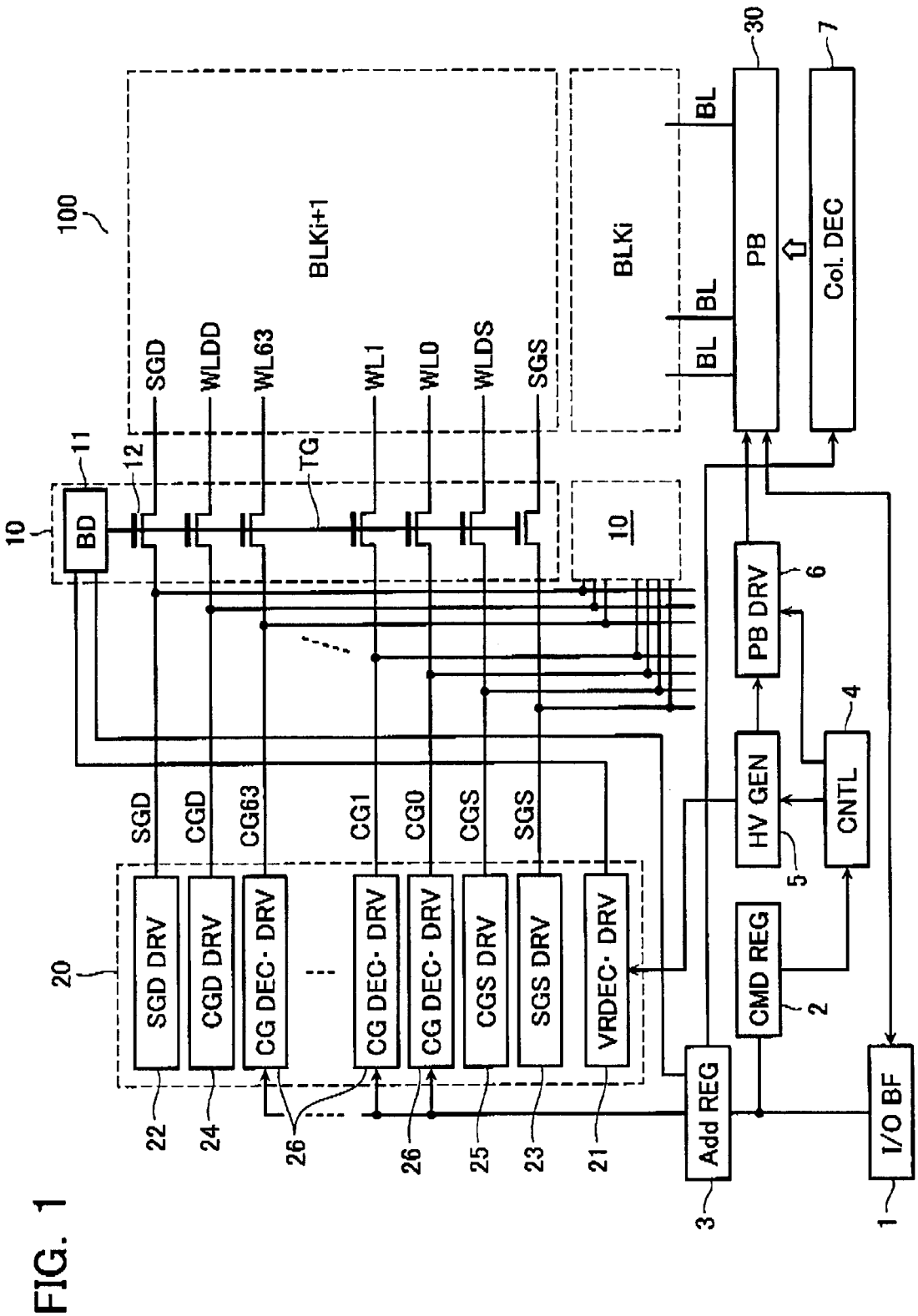
FIG. 1 shows a configuration of a NAND-type flash memory in accordance with an embodiment of the present invention.
Figure 2:
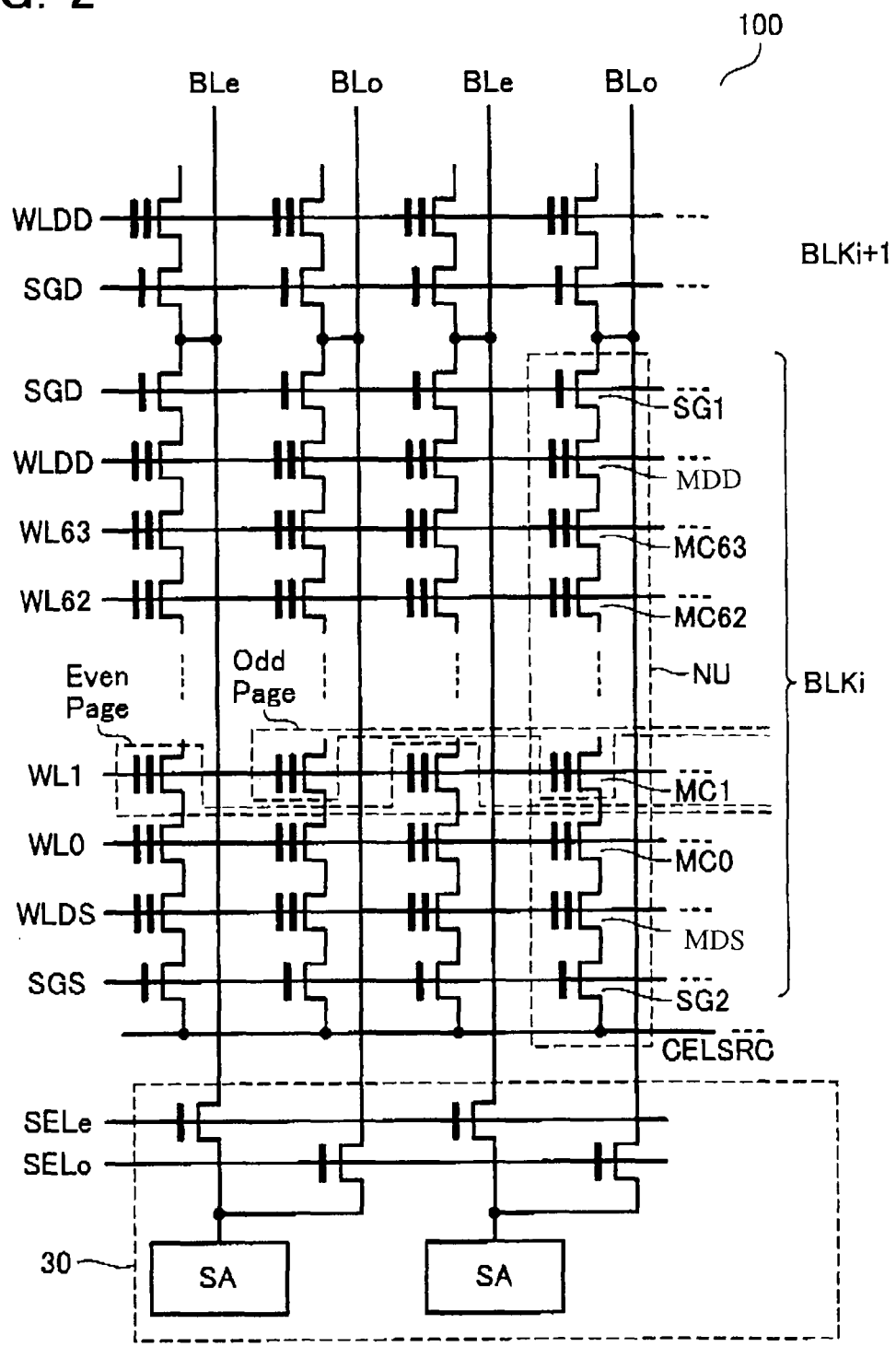
FIG. 2 shows the memory cell array and sense amplifier circuit of the flash memory.

FIG. 1 is a brief drawing of the whole configuration of a NAND-type flash memory in accordance with an embodiment. FIG. 2 shows an equivalent circuit of the memory cell array 100. A NAND cell unit (i.e., NAND string) NU serving as a unit cell of the NAND-type flash memory has such a basic configuration that a plurality of memory cells MC0-MC63 are connected in series, and two select gate transistors SG1 and SG2 are disposed at both ends thereof. This memory cell array 100 is formed with a design rule of 60 nm or less.

In this embodiment, dummy cells MDD and MDS are disposed adjacent to the select gate transistors SG1 and SG2, respectively, in the NAND cell unit NU. The dummy cells are formed as well as other memory cells except that these are not used for storing data and not accessible.

One end of the NAND cell unit NU is coupled to a bit line BL via the select gate transistor SG1: and the other end to a common source line CELSRC in the memory cell array 100 via the select gate transistor SG2.

One memory cell has N-type source/drain diffusion layers formed on a P-type well on a silicon substrate and a stacked gate structure with a floating gate (serving as charge storing layer) and a control gate stacked thereabove. Controlling the quantity of charge contained in the floating gate by a write/erase operation, cell's threshold voltage may be changed, whereby one bit data or multi bits data will be stored.

Control gates of the memory cells MC0-MC63 and dummy cells MDD, MDS are coupled to word lines WL0-WL63 and dummy word lines WLDD, WLDS, respectively; and gates of the select gate transistors SG1 and SG2 to select gate lines SGD and SGS, respectively. Each word line is coupled to control gates of the memory cells arranged along the same rows of the NAND cell unit arrangement. Similarly, dummy gate lines are coupled to control gates of the dummy cells arranged along the same rows of the NAND cell unit arrangement while the select gate lines are coupled to gates of the select gate transistors arranged along the same rows of the NAND cell unit arrangement.

A set of NAND cell units sharing word lines WL0-WL63, dummy word lines WLDD, WLDS and select gate lines SGD, SGS constitute a block BLK serving as a data erase unit collectively erased. Usually, as shown in FIGS. 1 and 2, a plurality of blocks (BLKi, BLKi+1, . . . ) are arranged in the direction of the bit line.

In the NAND-type flash memory, many kinds of operations are achieved together with command inputs. For example, in a write (i.e., program) operation mode, data load command is input via input/output circuit 1 to be latched in command register 2; write destination address is input via input/output circuit 1 to be latched in address register 3; and write data is loaded in sense amplifier circuit (serving as a data register) 30 via input/output circuit 1. Following it, latching a write-executing command in the command register 2 via input/output circuit 1, a write (or program) operation will be performed automatically and internally.

That is, in response to the write-executing command input, sequence controller 4 starts to execute a write sequence. Explaining in detail, the sequence controller 4 executes; voltage control necessary for writing; timing control for write voltage application operations and verify-read operations; and write sequence control of repeating write voltage application and verify-read until a desired write state is obtained.

High voltage generating circuit 5 generates write (or program) voltage Vpgm, write pass voltage Vpass, and other high voltages (boosted voltages) necessary in the row-system signal driver circuit 20 and page buffer control circuit 6 under the control of sequence controller 4.

Row-system driver circuit 20 has: CG decoder-drivers 26 for controlling word lines, the number of which is the same as that of word lines in a NAND cell unit; SGD driver 22 for controlling the drain side select gate line SGD; SGS driver 23 for controlling the source side select gate line SGS; CGD, CGS drivers 24, 25 for controlling dummy word lines WLDD, WLDS; and VRDEC driver 21 for outputting a boosted voltage VRDEC used in block decoders. These drivers 21-26 are shared by multiple blocks in memory cell array 100.

It is required of the NAND-type flash memory to apply few kinds of voltages to multiple word lines in a selected NAND cell. Page addresses, which are used for selecting a word line in a NAND cell unit, are input to the respective CG decoder-drivers 26.

Disposed at the word line end of each block in memory cell array 100 is a row decoder (in a narrow sense) 10 with a block selecting function. Row decoder 10 has a block decoder 11 for decoding block address transferred from address register 3; and a transistor array 12 with a common gate TG controlled by the block decoder 10, which transfers voltages necessary for writing, erasing or reading to word lines and select gate lines in a selected block. Block decoder 10 includes a level shift circuit for outputting a desired voltage applied to the common gate TG of the transistor array 12.

One ends of the transfer transistor array 12 are coupled to output nodes of drivers 21-26; and the other ends to word lines, dummy word lines and select gate lines in the cell array 100. For example, at a write pulse applying time, it is in need of applying write voltage Vpgm (about 20V) to a selected word line. At this time, the common gate TG of the transistor array 12 is applied with Vpgm+Vt (where Vt is a threshold voltage of transfer transistors), which is supplied from VDEC driver 21.

NAND-type flash memory uses FN tunnel current for writing and erasing. Specifically at a write time, it becomes possible to write many memory cells because a current necessary for shifting the threshold voltage of one cell is smaller than that in a NOR-type flash memory. Therefore, a page length defining as a collective processing unit in a read or write operation is set to be large such as 2 kByte or 4 kByte. The sense units SA in the sense amplifier circuit 30 serving as a page buffer are prepared the same numbers as the page length.

Column decoder 7 decodes the column address supplied from address register 3 or controller 4, and couples selected sense amplifiers to input/output circuit 1, whereby write data are loaded in the sense amplifier circuit 30 column by column at a write time. At a read time, page read data collectively read in the sense amplifier circuit are serially output to input/output circuit 1 in accordance with column address column by column.

Having omitted in FIG. 1, there is inserted such a circuit between the input/output circuit 1 and page buffer 30 that is configured to achieve data input/output within certain cycles.

FIG. 2 shows such an example that an even bit line BLe and an odd bit line BLo share a sense amplifier SA. At a write time or read time, the even bit line BLe or odd bit line BLo are selected by select signal SELe or SELo to be coupled to the sense amplifier SA. At this time, serving as shield lines, non-selected bit lines may suppress the interference between bit lines.

In such a case that word line WL1 is selected in the sense amplifier scheme shown in FIG. 2, memory cells selected by a selected word line and all even bit lines constitute a page (i.e., even page) serving as a read or write unit; and memory cells selected by the selected word line and all odd bit lines constitute another page (i.e., odd page) serving as a read or write unit.

Figure 3:
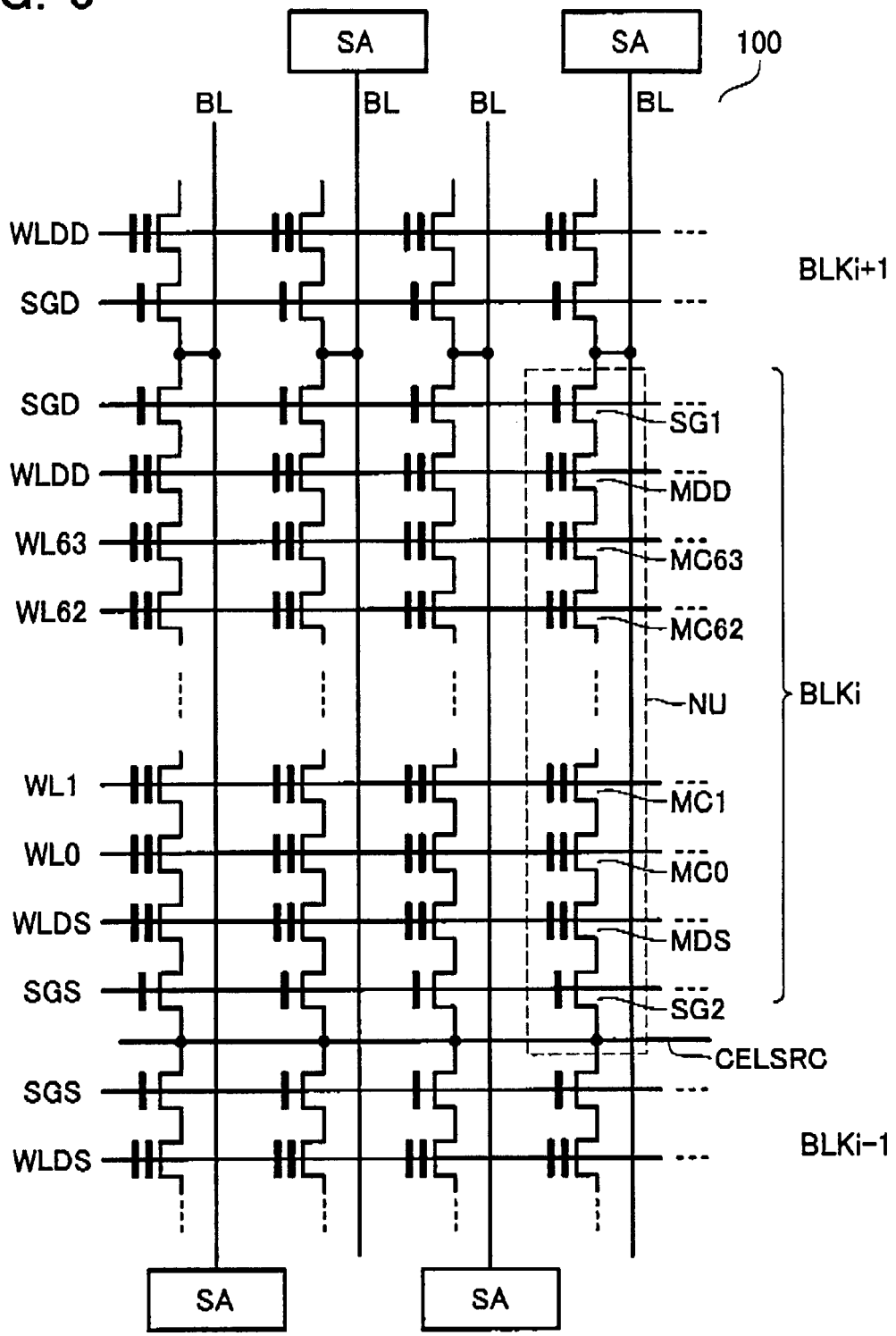
FIG. 3 shows another sense amplifier circuit with the memory cell array.

By contrast, FIG. 3 shows such an example that all memory cells arranged along a word line constitute a page.

Figure 4:
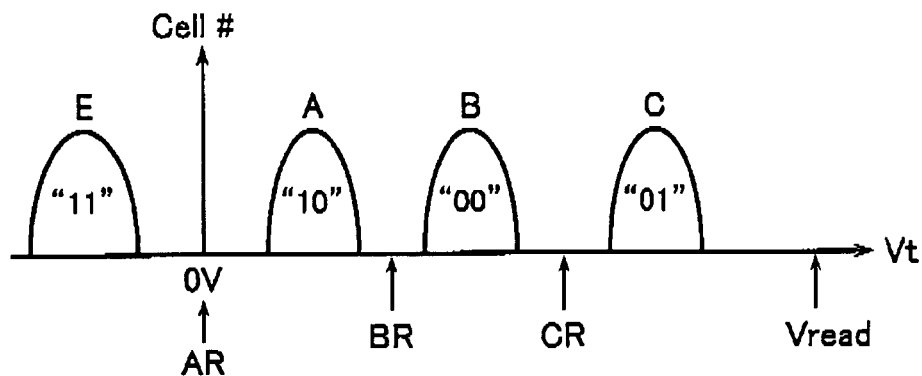
FIG. 4 shows data states of four-level data storage scheme of the flash memory.

FIG. 4 shows the relationship between threshold states and data of a memory cell in a case where a multi-level data storage scheme is adapted. In this example, the multi-level data is defined as four-level data expressed by 2-bit data "xy". This 2-bit data to be stored in a memory cell are assigned to two row addresses. That is, the lower page bit "y" is a read data when a lower page address is selected while the upper page bit "x" is a read data when an upper page address is selected.

Erase state "E" is a negative threshold voltage state and defined as "11" while write or program states "A", "B" and "C" arranged in the order of positive threshold voltages are defined as "10", "00" and "01", respectively.

Figure 5:
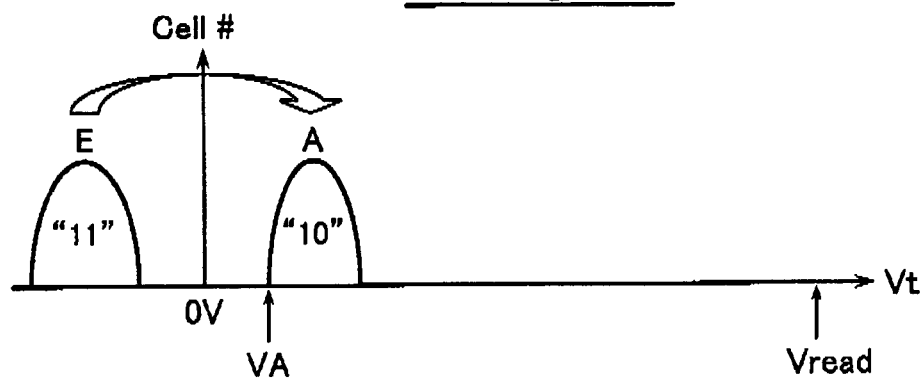
FIG. 5 shows the data transition of the lower page write.

With this data bit assignment method, a data write method will be explained with reference to FIGS. 5 and 6. FIG. 5 shows a lower page write method. Selectively writing data "0" in memory cells in the erased threshold state "E" (data state "11"), threshold state "A" (data state "10") is set. At this time, a "1" write cell, the threshold voltage of which is not shifted, is kept at data state "11".

Figure 6:
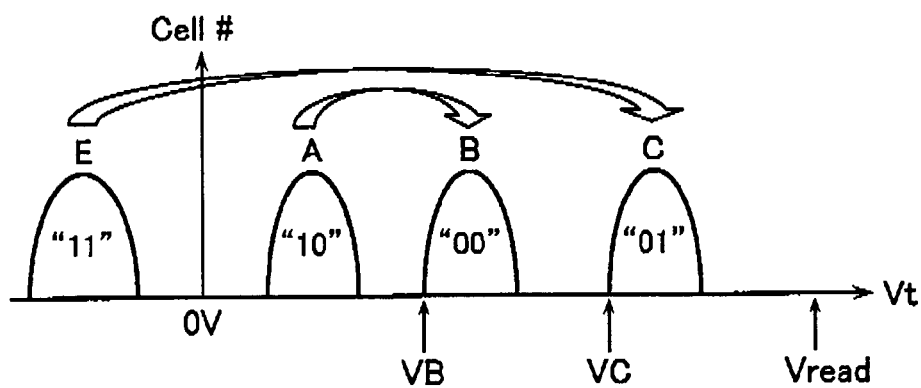
FIG. 6 shows the data transition of the upper page write.

FIG. 6 shows the upper page write method. In case an upper page write data is "0" for a cell of data "11", the cell's threshold voltage is shifted from data state "E" to data state "C" (i.e., from data state "11" to data state "01"). In case an upper page write data is "0" for a cell of data "10", the cell's threshold voltage is shifted from data state "A" to data state "B" (i.e., from data state "10" to data state "00"). "1" write cells keep the threshold voltages of data "11" and "10", respectively.

It is required of this four-level data storage scheme to perform the lower page write in advance of the upper page write.

In the four-level data storage scheme, it is in need of setting three write threshold states as described above, Therefore, it is necessary to sufficiently suppress the erroneous write in a "1" write cell, the threshold voltage of which should not be shifted.

Data write or program is performed page by page after collectively erasing all memory cells in a selected block. For example, word lines are selected in order from word line WL0 near the select gate line SGS on the source line CELSRC side, and data write is performed for even page and odd page independently of each other, or one page including them simultaneously.

This embodiment has such a main purpose at a write time as to prevent "1" write cells (write-inhibited cells) selected by word lines WL0 and WL63 disposed near the select gate lines SGS and SGD from being erroneously written due to GIDL current. For this purpose, the dummy cells MDS, MDD inserted near the select gate transistors SG2, SG1 are set to have a threshold voltage higher than the erased state threshold voltage of memory cells MC0-MC63.

Some erase algorisms will be explained below.

[First Erase Algorithm]

Data erase is basically performed by the steps of: a collective erase operation for all cells including dummy cells in a selected block; and a soft write (or program) operation for eliminating over-erase states. At the collective erase time, all word line including dummy word lines in a selected block are applied with 0V; and P-type well, on which the memory cell array is formed, is applied with a boosted erase voltage Vera (=8~20V). With this voltage application, all memory cells in the selected block are brought to a negative threshold state (erase state), which is obtained by discharging electrons in the floating gate.

In this erase operation, the lowest value of the threshold voltage distribution is not usually monitored. Therefore, the erase states contain some over-erase states in the memory cells. In consideration of this, to dissolve the over-erase states, soft write will be performed with a soft write voltage Vspgm (=10-15V) lower than the write voltage Vpgm(=15-20V).

In the first erase algorism, following the above-described erase sequence, a write sequence is performed as to set the dummy cells in a certain positive threshold voltage range.

Figure 7:
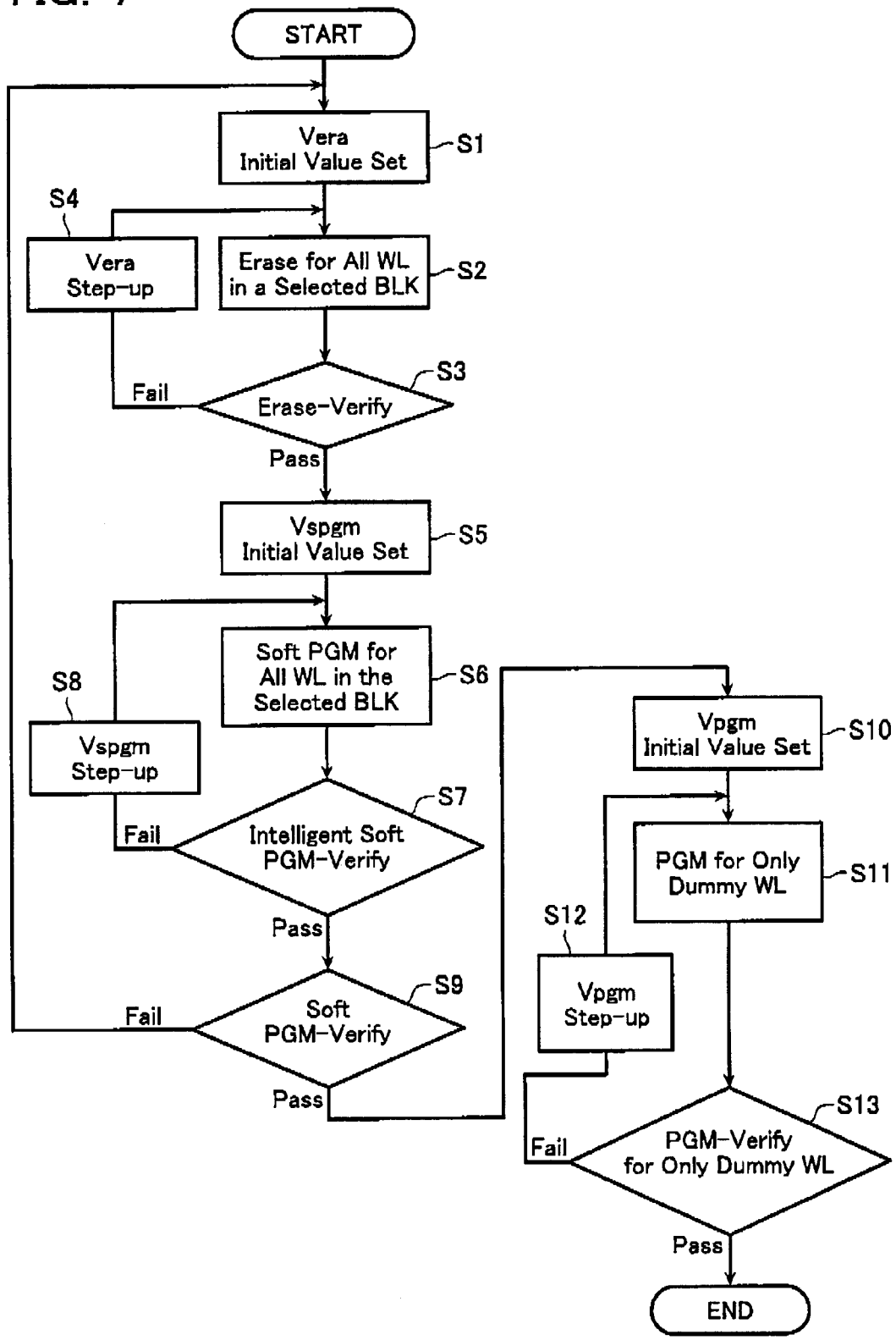
FIG. 7 shows an example of a first erase algorism in accordance with the embodiment.

FIG. 7 shows the first erase algorism.

After setting an initial value of erase voltage Vera (step S1), all memory cells in a selected block are erased (step S2), and then erase-verify is performed (step S3). Erase-verify is an operation for verifying that all memory cells in the NAND cell units have been erased to a negative threshold voltage state (about −0.8V).

Explaining in detail, the erase-verify is performed by detecting whether a bit line has been charged up to 0.8V or not under the condition that all word lines are applied with 0V, cell current is carried from the cell source line CELSRC to the bit line. If the bit line is charged up to 0.8V, it will be verified that all memory cells in the NAND cell unit have been erased at a threshold voltage state of −0.8V.

If all NAND cell units have not been erased, the erase voltage is stepped up (step S4), and the erase operation will be performed again (step S2).

Figure 9:
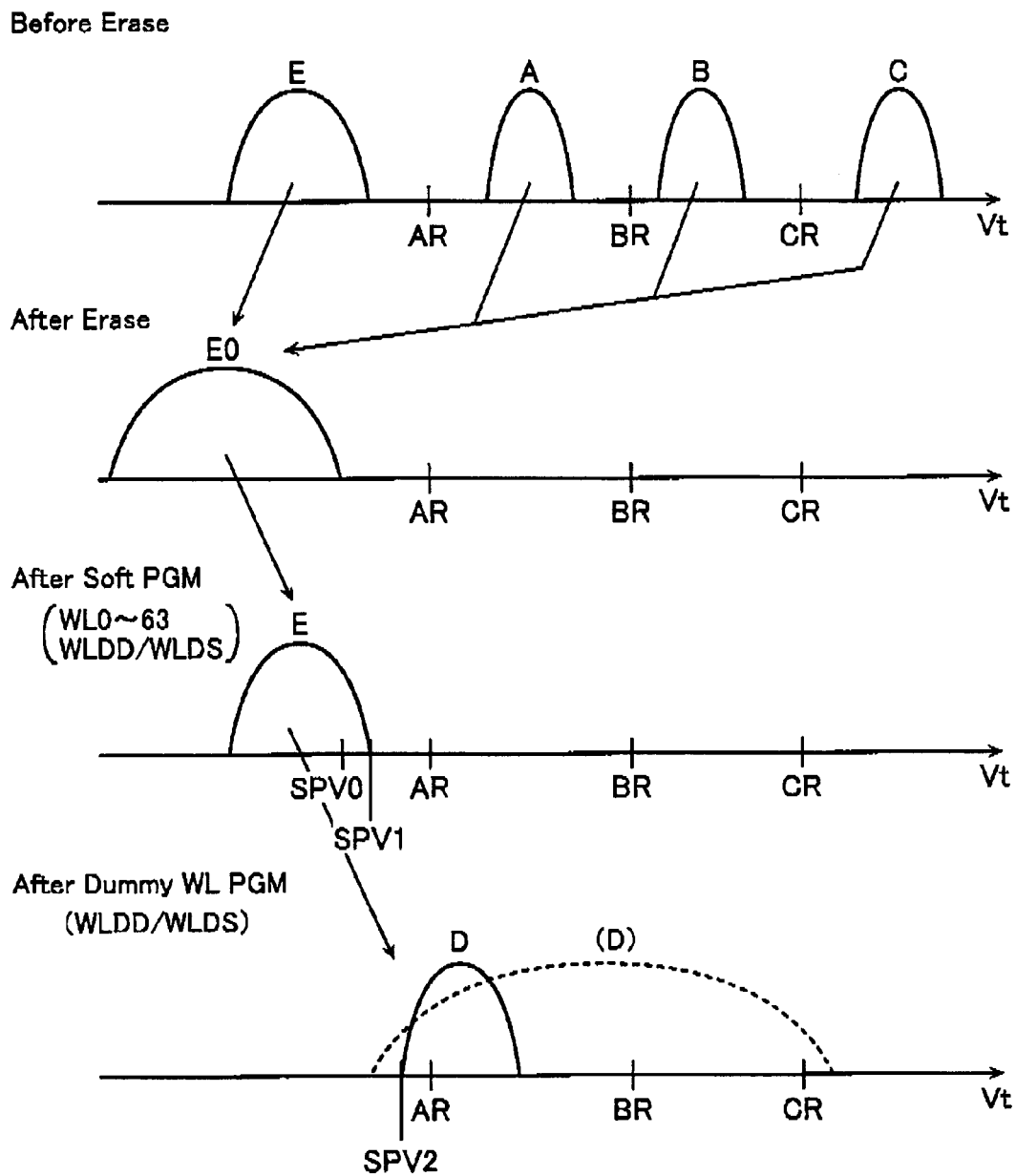
FIG. 9 shows the data transition in accordance with the first erase algorism.

FIG. 9 shows a change situation of data threshold distributions in case of a four-level data storage scheme. Before data erase, there are distributed data states E, A, B and C. Since the lower limit value of the threshold distribution is not defined in the erase operation, when all NAND cell units have passed the verify-erase, there will be provided a negative threshold data state E0 with a wide distribution.

After having passed the data erase, to dissolve the over-erase state, soft write voltage Vspgm is initialized (step S5) and soft write is performed (step S6). The soft write is performed with the write voltage Vspgm applied to all word lines including dummy word lines in the selected block to inject electrons in the floating gates of all cells including dummy cells.

Following it, intelligent soft write (or program) (ITSP) is performed (step S7), which is for verifying that a certain number of erased NAND cell units have been over the erase-verify level −0.8V. Explaining in detail, based on the same operation as the erase-verify, it will be counted such the number of NAND cell units that bit lines are not charged up as a result of that a cell threshold voltage is over −0.8V (i.e., cell current does not flow) in a NAND cell unit.

That is, detecting that a certain number of NAND cell units passed ITSP verify-level SPV0 shown in FIG. 9, the write-verify will pass. If the verify fails, the write voltage is stepped up (step S8), and the soft write will be performed again (step S6).

If the ITSP verify has passed at step S7, verify level SPV1, for example −0.4V, is set at a slightly higher threshold voltage than the previous verify level SPV0, and soft write (or soft program, SP)-verify is performed for verifying that all cells have been set at lower than the threshold level (step S9).

At this verify step, all word lines are applied with 0.4V, and it is detected for judging PASS that a bit line has been charged up to 0.8V with a cell current flowing from the cell source line CELSRC to the bit line. With this verify, it is possible to confirm that the threshold voltage of all cells has been set under −0.4V.

If the bit line charge level is insufficient, i.e., the uppermost value of the threshold voltage is over the verify level SPV1, the SP verify is judged as FAIL (erase fail), and the erase operation will be repeated from the initial step.

In the normal erase algorism, the sequence ends when passing the SP verify. In this embodiment, following it, data write (or program) for dummy cells MDD and MDS is performed as follows. Write voltage Vpgm is set at an initial value (step S10), and write for dummy word lines WLDD and WLDS in the selected block is successively performed (step S18). The example in FIG. 7 shows such a case that memory cells in one page, which is defined by those arranged along a word line, are written at a time, for example, with the sense amplifier scheme shown in FIG. 3.

In detail, dummy word lines WLDD and WLDS are applied with write voltage Vpgm; the whole remaining word lines with write pass voltage Vpass; and Vss to NAND cell channels via bit lines. As a result, in the dummy cells disposed along the dummy word lines WLDD and WLDS, electrons are injected into floating gates thereof.

After writing, write-verify is performed for every dummy word line WOLDD, WLDS (step S13). For example, it will be detected whether dummy cells on a selected dummy word line have been written to verify level SPV2 or not, which is defined as the lower limit of a desired threshold distribution. At the write-verify step, the selected dummy word line is applied with a verify voltage; and other word lines with a certain read pass voltage, to detect the discharge state of precharged bit lines. These write (or program) step S11 and verify step S13 are the same as in the conventional NAND flash memory.

If write is insufficient, the write voltage is stepped up (step S12), and write will be repeated until the write-verify passes.

As a result of the above-described dummy word line write, it is possible to obtain the data state D shown in FIG. 9, which is higher than the threshold voltage of other cells. In this write-verify sequence, it is also permitted to use one of verify voltages VA, VB and VC for verifying data A, B and C, respectively. Further, in this dummy cell writing, data state D may be set at a threshold distribution state, which is wider than the above-described example, as shown by a dotted line in FIG. 9.

Figure 8:
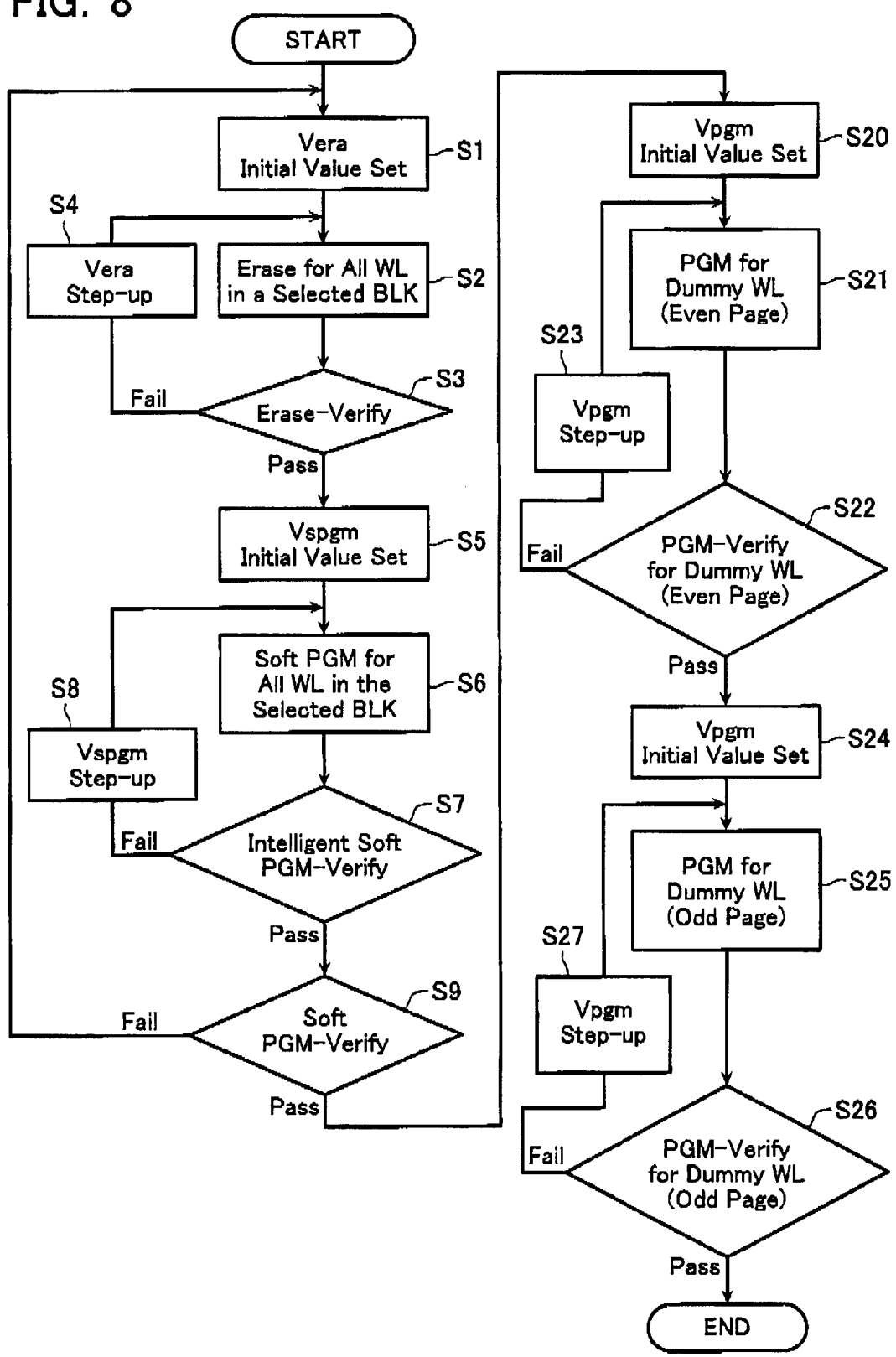
FIG. 8 shows another example of the first erase algorism.

FIG. 8 shows such an erase algorism that dummy word line write (or program) is performed by even page write and odd page write with the common sense amplifier scheme shown in FIG. 2, which is basically the same as the erase algorism shown in FIG. 7.

Explaining in detail, erase operation and soft write operation from step S1 to step S9 are the same as those shown in FIG. 7. Thereafter, with respect to dummy word lines WLDD and WLDS, even page write steps S20-S23 and odd page write steps S24-S27 are sequentially performed. As a result, it is possible to obtain the same result as in the case explained with reference to FIG. 7.

As described above, dummy cells disposed adjacent to the select gate transistors are set at a higher threshold state than the erase state of other cells, whereby the write error rate will be reduced. The detailed reason will be explained in detail after explaining the following second erase algorism.

[Second Erase Algorism]

The first erase algorism described above was designed to have a dummy cell write sequence in addition to the conventional erase algorism. By contrast, this second erase algorism was designed to write the dummy cells to be in a threshold state higher than other cells in the soft write sequence after erasing. The details will be explained below.

Figure 10:
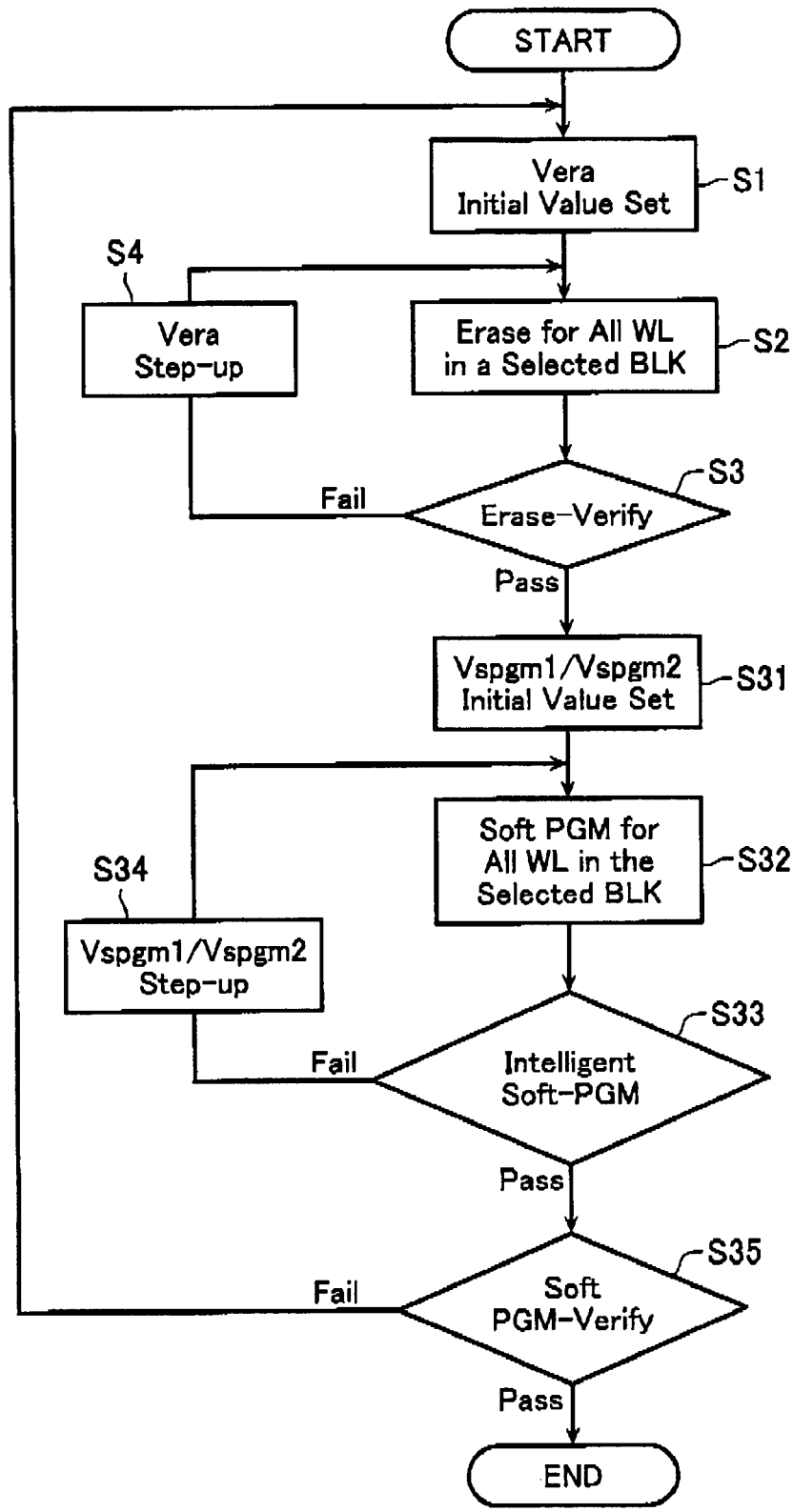
FIG. 10 shows a second erase algorism.

FIG. 10 shows the second erase algorism. The erase sequence defined by steps S1-S4 is the same as the first erase algorism described above. As a result, as shown in FIG. 11, all memory cells including dummy cells are set at an erase state E0.

If the erase-verify passes, soft write (or program) is performed. At this time, initial values of write voltage Vspgm1 for memory cells and that Vspgm2 for dummy cells are set independently of each other (step S31), and all cells in the selected block are subjected to soft write simultaneously (step S32).

Figure 12:
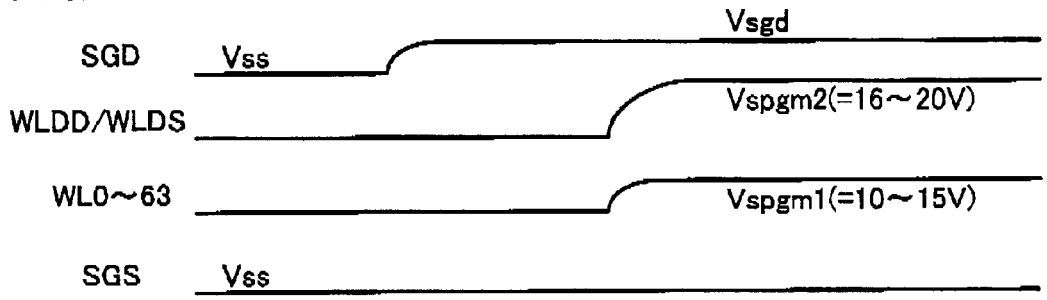
FIG. 12 shows internal voltage waveforms at a soft program time in accordance with the second erase algorism.

FIG. 12 shows the internal voltage waveforms at this soft write time, in which write voltage Vspgm1 (=10V~15V) is applied to word lines WL0-WL63 in the selected block; another soft write voltage Vspgm2 (=16V~20V) to dummy word lines WLDD and WLDS; and Vsgd to the bit line side select gate line SGD for transferring Vss of a bit line to the NAND cell channel.

As a result, electrons are injected into the floating gates of all memory cells including dummy cells in the NAND cell unit. Since soft write voltages are set to satisfying the relationship of Vspgm1<Vspgm2, the threshold voltage increase of the dummy cells is larger than that of the other cells.

Next, intelligent soft write-verify (or soft program-verify) (ITSP) is performed (step S33). Similar to the above-described first erase algorism, it will be detected whether a certain number of erased NAND cell units are over an erase-verify level −0.8V or not.

That is, when a certain number of NAND cell units are counted to be over the ITSP verify level SPV0(=−0.8V), this verify passes. If this verify is failed, write voltages Vspgm1/Vspgm2 are stepped up (step S34), and soft write will be repeated (step S32).

After passing the ITSP verify step S33, soft write-verify is performed (step S35). This soft write-verify step S33 is performed to verify simultaneously the following two conditions: the threshold distribution of memory cells on the word lines WL0-WL63 is under the verify level SPV1 set at slightly higher than the ITSP verify level SPV0; and the threshold distribution of the dummy cells on the dummy word lines WLDD and WLDS is under the verify level SPV2 set at slightly higher than SPV1.

In contrast to that the verify voltage SPV2 at the soft write time in the first erase algorism is for judging the lower limit of the threshold distribution, the verify voltage SPV2 at the soft write time in the second erase algorism is for judging the upper limit of the threshold distribution like the memory cell's verify voltage SPV1.

Figure 13:
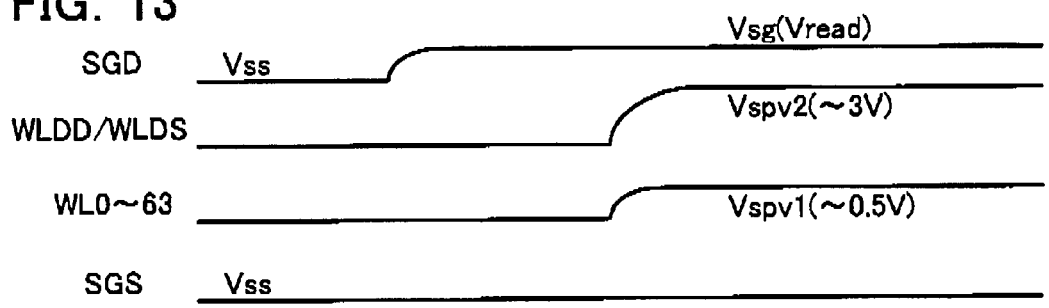
FIG. 13 shows internal voltage waveforms at a soft program-verify time in accordance with the second erase algorism.
Figure 14:
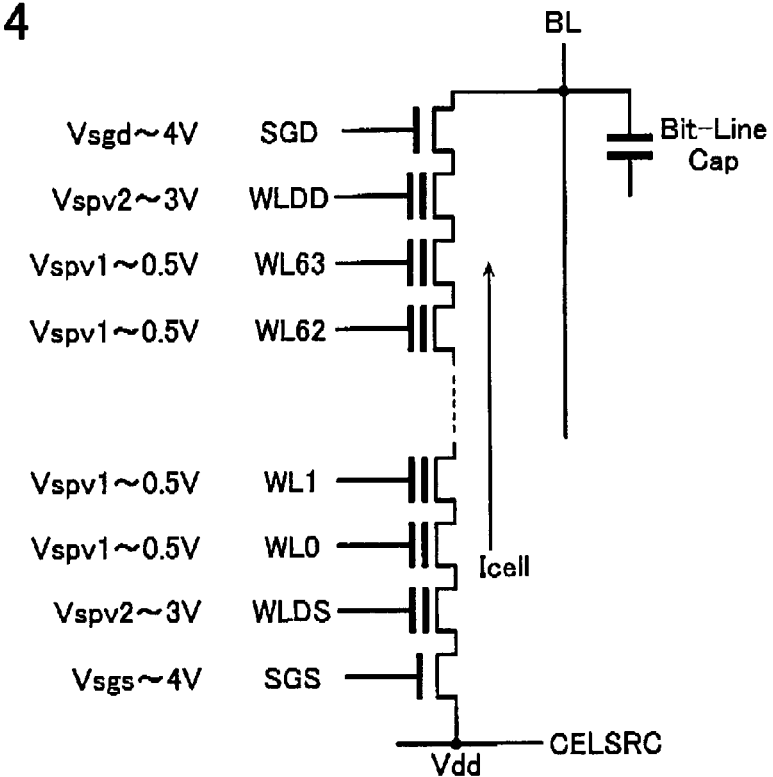
FIG. 14 shows bias states in the NAND cell unit at the soft program-verify time.

FIG. 13 shows internal voltage waveforms at the soft write-verify time; and FIG. 14 shows a bias state in a NAND cell unit and the cell current Icell flowing state.

Select gate lines SGD and SGS are applied with voltages Vsgd and Vsgs (or common read pass voltage Vread, for example, about 4V) for sufficiently turning on the select gate transistors; word lines WL0-WL63 are applied with verify voltage Vspv1 (about 0.5V) for verifying the upper limit of the threshold voltage, SPV1 (for example −0.5V); dummy word lines WLDD and WLDS are applied with verify voltage Vspv2 (about 3V) for verifying the upper limit of the threshold voltage, SPV2 (for example 2V); and the source line CELSRC is applied with Vdd for carrying cell current Icell from the source line CELSRC to the bit line BL.

With this voltage application, if it is detected that the bit line is charged up to about 1V, the verify is passed. As a result, as shown in FIG. 11, it will be verified that the upper limit of the cell's threshold voltage is equal to or smaller than about SPV1=−0.5V and the upper limit of the dummy cell's threshold voltage is equal to or smaller than about PV2=2V.

In case the upper limit of the cell's threshold voltage is over SPV1 or the upper limit of the dummy cell's threshold voltage is over SPV2, the bit line is not charged up to a certain level. In this case, soft write-verify is judged as being failed with a certain judging level at the step S35 (the erase fails), and the erase sequence will be performed again.

It is not required of the second erase algorism to perform such an additional write sequence for dummy cells as in the first erase algorism. Therefore, there is provided such an advantageous effect in this second erase algorism that the high speed performance is obtained in comparison with the first erase algorism.

In the two erase algorisms described above, dummy cells disposed adjacent to the select gate transistors are set at a threshold level higher than the erase state of memory cells. With this scheme, the write error rate may be reduced in the write sequence. The reason will be explained in detail below for such a case that an EASB method is used as the channel voltage control scheme in a write mode.

Figure 15:
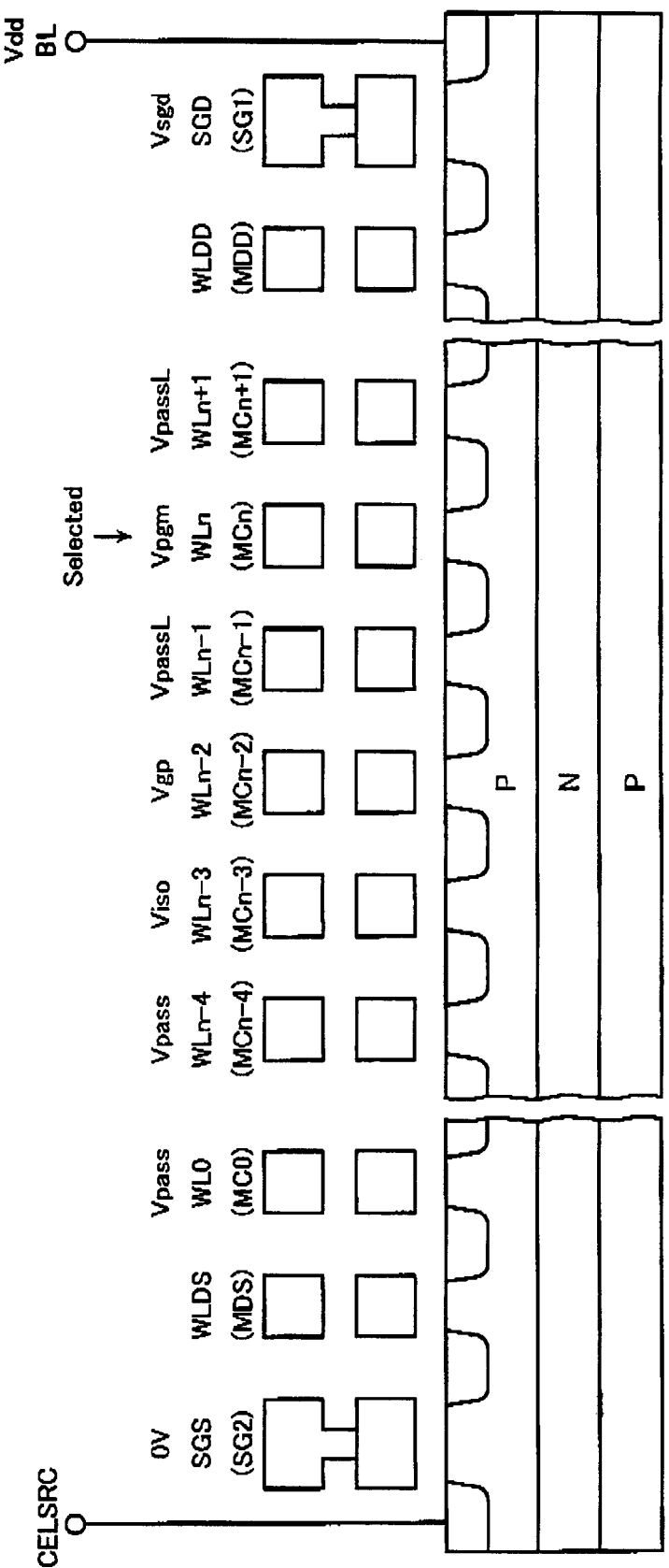
FIG. 15 shows a voltage apply condition in the NAND cell unit when word line WLn is selected at a write time in accordance with an EASB scheme.

FIG. 15 shows a voltage application condition in a NAND cell unit when word line WLn is selected at a "1" write time with Vdd applied to a bit line. Bit line side select gate line SGD is applied with Vsgd for turning on the select gate transistor; source line side select gate line SGS with 0V; the selected word line WLn with a write voltage Vpgm (for example, 15~20V); two non-selected word lines WLn−1, WLn+1 disposed adjacent to the selected word line with write pass voltage VpassL (for example, 8V); non-selected word line WLn−2 next to word line WLn−1 on the source line side with voltage Vgp (for example, 4V); non-selected word line WLn−3 next to the word line WLn−2 on the source line side with channel isolating voltage Viso (for example, 1V); and the remaining non-selected word lines and dummy word lines with pass voltage Vpass(>VpassL) or VpassL.

With this voltage application, the NAND cell channel is divided into two boost channel areas, which are separated from each other with a boundary defined by the channel of memory cell MCn−3 under word line WLn−3 to be boosted independently of each other. Between the selected cell MCn with write voltage Vpgm applied and non-selected cell MCn−3 with channel isolating voltage Viso applied, driving voltages Vpgm, VpassL, Vgp and Viso are applied in such a manner that these voltages are gradually stepped down as defined by: Vpgm>VpassL>Vgp>Viso, so that the electric field in these channel areas are relaxed. Therefore, erroneous write does not occur easily in the selected cell due to Vpgm stress. This is a basic property of the EASB scheme.

Next, it will be considered such a case that word line WL0 adjacent to the dummy word line WLDS on the source line CELSRC side is selected. At this time, as shown in FIGS. 16 and 17, word line WL0 is applied with write voltage Vpgm; and dummy word line WLDS adjacent to the selected word line WL0 with pass voltage Vpass.

Figure 16:
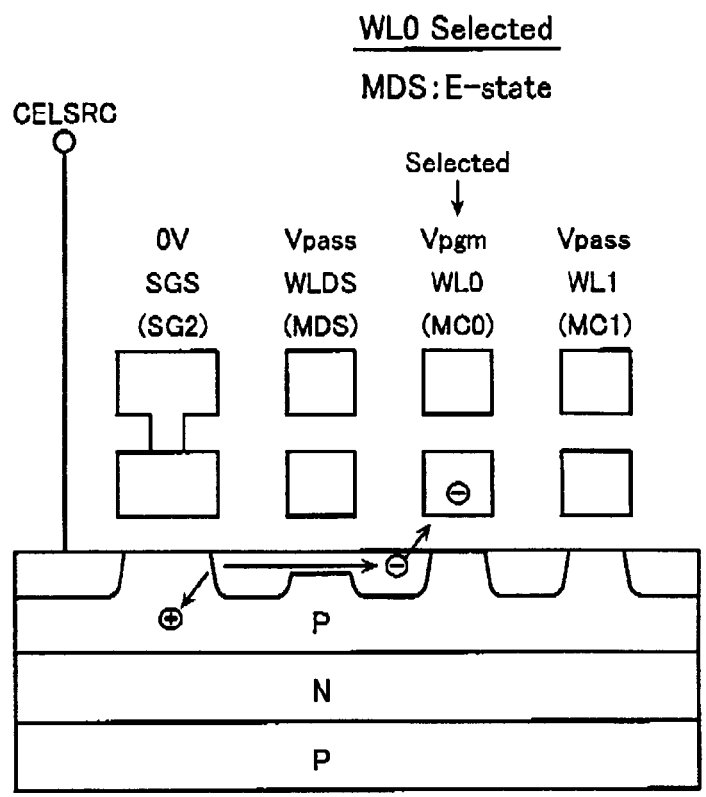
FIG. 16 shows a voltage apply condition in an area near the word line WL0 when it is selected in a case where dummy cell MDS is in data state E.

FIG. 16 shows such a case that dummy cell MDS under the dummy word line WLDS is in the erase state with a negative threshold voltage. In this case, GIDL current flows at the drain edge of the select gate transistor SG2, and electrons pass through the dummy cell's channel to be "hot electrons", which may be injected into the floating gate of the neighboring memory cell MC0.

Figure 17:
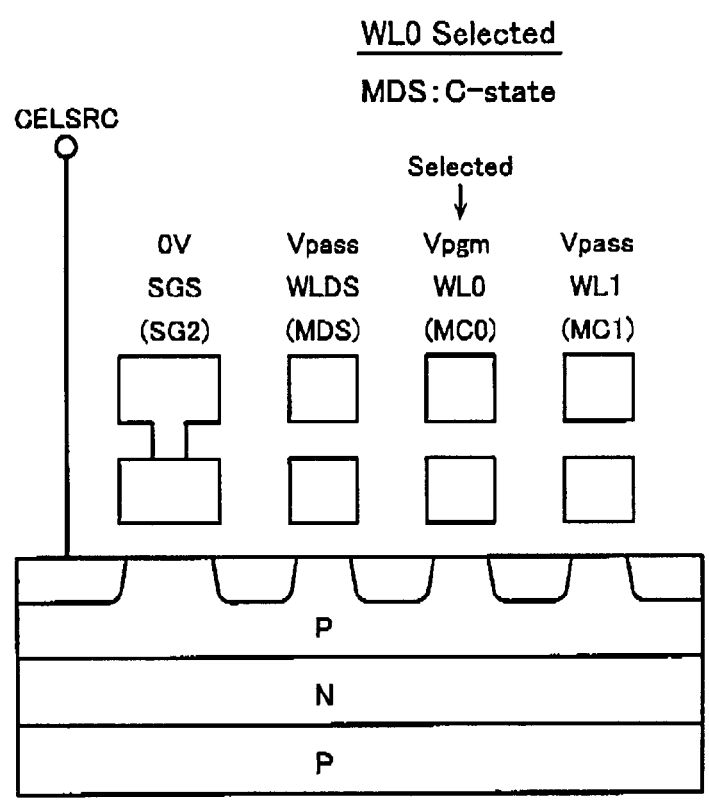
FIG. 17 shows a voltage apply condition in an area near the word line WL0 when it is selected in a case where dummy cell MDS is in data state C.

By contrast, FIG. 17 shows a case where dummy cell MDS has a higher threshold voltage than other memory cells, and set in, for example, data state D shown in FIG. 11. In this case, even if GIDL current flows at the drain edge of select gate transistor SG2, electrons do not flow to the selected cell MC0 on the assumption that the dummy cell MDS is not turned on. Therefore, error write dose not occur in the selected cell MC0.

It will be explained a random data write test for 256 blocks with respect to such two cases that dummy cell MDS is in the erase state shown in FIG. 16 and in data state D shown in FIG. 17. Pass voltage applied to the dummy word line WLDS is Vpass=8.48V. In case the dummy cell is in the data state E (threshold voltage is equal to or lower than 0V), the channel voltage between dummy word line WLDS and select gate line SGS is about 10V while in case the dummy cell is in the data D state (threshold voltage is equal to or lower than 3V), the channel voltage is about 5V.

As a result of measuring the number of write fails (defective bit numbers), it is 49 in the case of FIG. 16 while it is 7 in the case of FIG. 17. That is, it has been confirmed that the write error rate was reduced in accordance with this embodiment.

There will be provided the same effect as described above in the case where word line WL63 (memory cell MC63) adjacent to the dummy word line WLDD (dummy cell MDD) is selected. According to a test, it is confirmed that GIDL current flows at the drain edge of the select gate transistor SG1 when the voltage Vsgd applied to the select gate line SGD on the bit line side is over a certain level. However, being set in the higher threshold state than other memory cells, the dummy cell MDD on the select gate line SGD side becomes to have a high channel resistance even if MDD is on. Therefore, it becomes possible to prevent the selected cell on the selected word line WL63 from being erroneously written.

The cell channel voltage control scheme is not limited to the EASB scheme. FIG. 18 shows collectively some channel voltage control schemes adaptable in the present invention with respect to a case where word line WLn is selected.

There are prepared two cases defined as the normal self boost (SB) scheme as follows: one case where non-selected word line adjacent to the selected word line WLn is applied with pass voltage VpassL, and other non-selected word lines are applied with the same pass voltage VpassL; and another case where non-selected word line adjacent to the selected word line WLn is applied with pass voltage VpassL, and other non-selected word lines are applied with the pass voltage Vpass (>VpassL). Having omitted in the drawing, there will be prepared another option, in which dummy word lines WLDD and WLDS are applied with Vgp.

As the erase area self boost (EASB) scheme, two cases of EASB(1) and EASB(2) are shown. EASB(2) is the example described above. EASB(1) shows such a case that the non-selected word line with the channel isolating voltage Viso applied is located nearer to the selected word line WLn than EASB(2). There are also prepared other options of voltages applied to non-selected word lines and dummy word lines similar to the above-described SB scheme and EASB scheme.

In a column disposed on the most right side in FIG. 18, there is shown a case where word line WL0 is selected with SB scheme.

[Application Devices]

As an embodiment, an electric card using the non-volatile semiconductor memory devices according to the above-described embodiments of the present invention and an electric device using the card will be described bellow.

Figure 19:
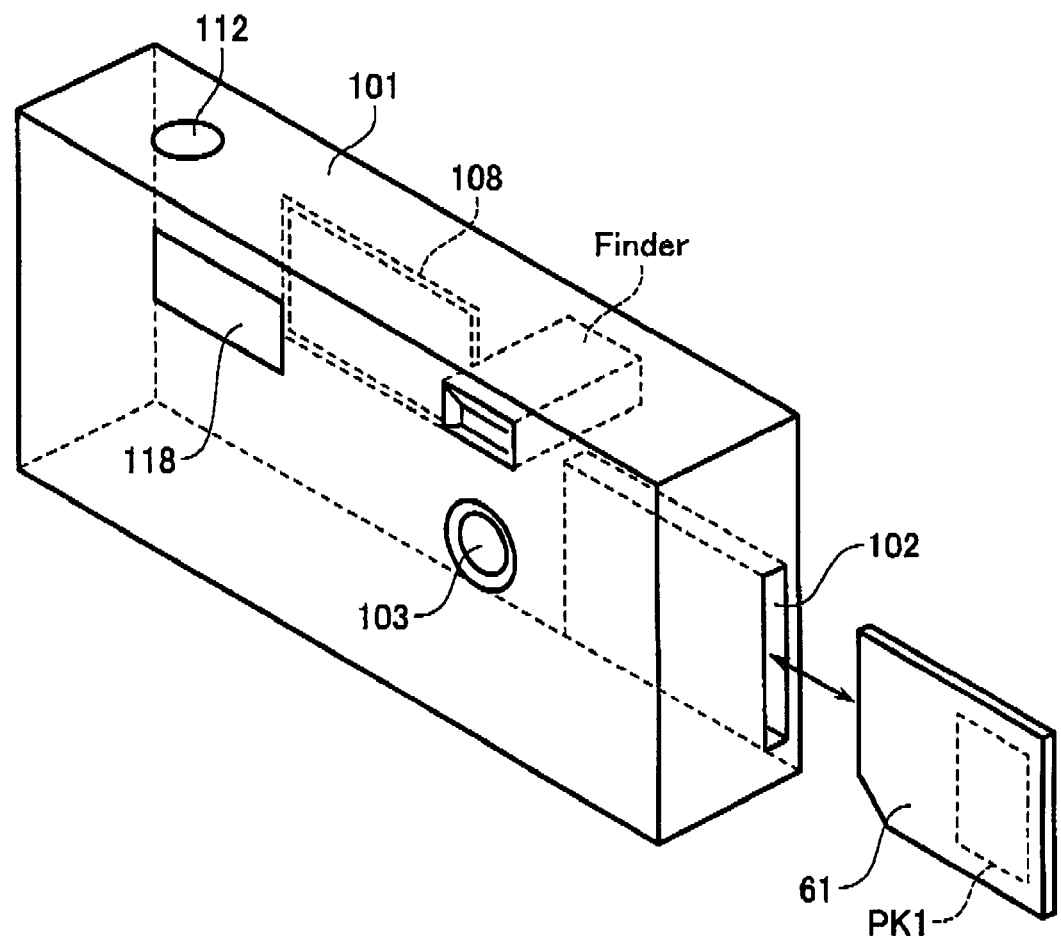
FIG. 19 shows another embodiment applied to a digital still camera.

FIG. 19 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 20:
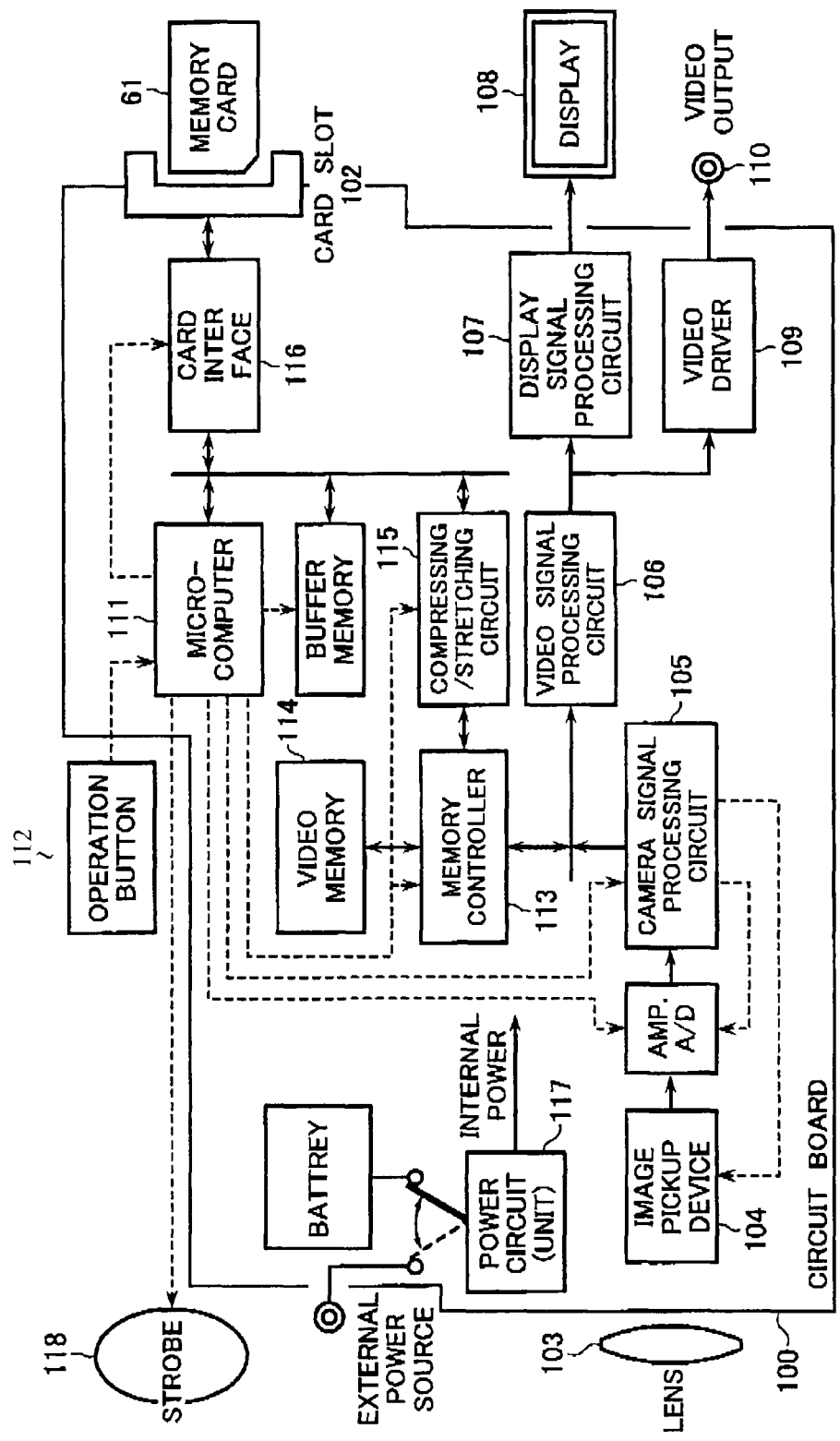
FIG. 20 shows the internal configuration of the digital still camera.
Figure 21A:
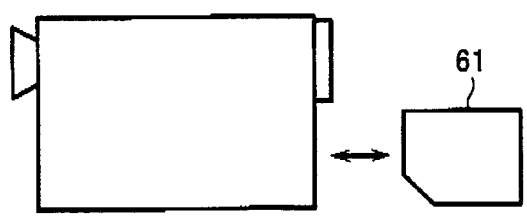
FIGS. 21A to 21J show other electric devices to which the embodiment is applied.
Figure 21B:
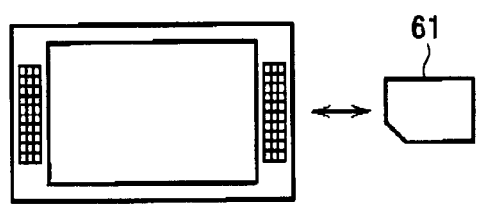
Figure 21C:
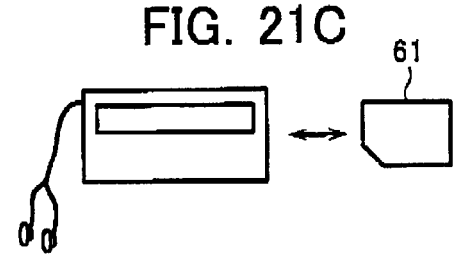
Figure 21D:
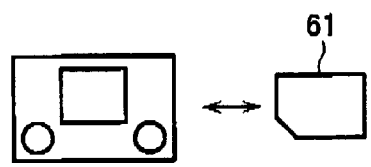
Figure 21E:
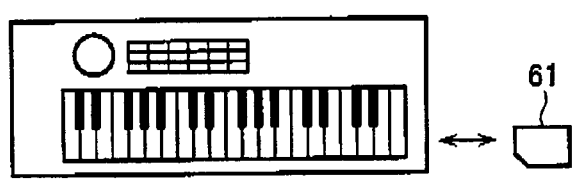
Figure 21F:
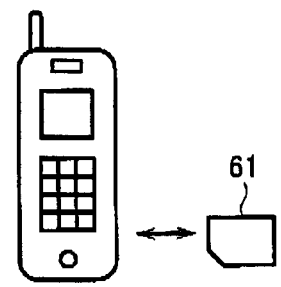
Figure 21G:
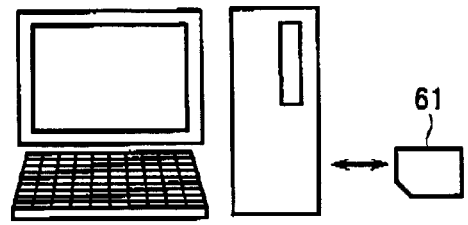
Figure 21H:
Figure 21I:
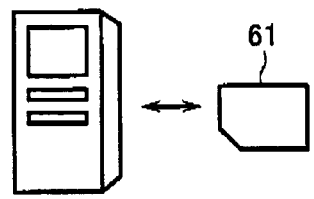
Figure 21J:
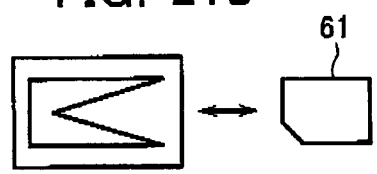

FIG. 20 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 21A to 21J, as well as in portable electric devices. That is, the electric card can also be used in a video camera shown in FIG. 21A, a television set shown in FIG. 21B, an audio apparatus shown in FIG. 21C, a game apparatus shown in FIG. 21D, an electric musical instrument shown in FIG. 21E, a cell phone shown in FIG. 21F, a personal computer shown in FIG. 21G, a personal digital assistant (PDA) shown in FIG. 21H, a voice recorder shown in FIG. 21I, and a PC card shown in FIG. 21J.

This invention is not limited to the above-described embodiment. It will be understood by those skilled in the art that various changes in form and detail may be made without departing from the spirit, scope, and teaching of the invention.

What is claimed is:

1. A semiconductor memory device with NAND cell units arranged therein, the NAND cell unit comprising:
   a plurality of electrically rewritable and non-volatile memory cells connected in series;
   a first select gate transistor disposed at one end of the NAND cell unit for coupling it to a bit line;
   a second select gate transistor disposed at the other end of the NAND cell unit for coupling it to a source line; and
   dummy cells disposed adjacent to the first and second select gate transistors in the NAND cell unit, wherein
   the dummy cells are set at a state with a threshold voltage higher than that of an erase state of the memory cell.

2. The semiconductor memory device according to claim 1, wherein
   the memory cells and the dummy cells in the NAND cell unit are erased prior to data programming, and thereafter
   the memory cells and the dummy cells are set at an erase state with a first threshold voltage by dissolving an over-erase state with a soft program sequence, and wherein
   the dummy cells in the NAND cell unit are set at a state with a second threshold voltage higher than the first threshold voltage with a program sequence.

3. The semiconductor memory device according to claim 2, wherein
   the soft program sequence includes: a program operation for programming the memory cells and the dummy cells with a program voltage Vspgm applied to them; and a verify operation for verifying the program state by detecting a bit line voltage under the condition that the memory cells and the dummy cells are applied with a verify voltage, and wherein
   the program sequence for the dummy cells includes: a program operation for programming the dummy cells with a program voltage Vpgm applied to the dummy cells and with a program pass voltage applied to the memory cells; and a verify operation for verifying the program state of the dummy cells by detecting a bit line voltage under the condition that the dummy cells are applied with a verify voltage and the other memory cells are applied with a read pass voltage.

4. The semiconductor memory device according to claim 1, wherein
   the memory cells and the dummy cells in the NAND cell unit are erased prior to data programming, and thereafter with a soft programming sequence, the memory cells are set at an erase state with a first threshold voltage by dissolving an over-erase state, and the dummy cells are set at a state with a second threshold voltage higher than the first threshold voltage.

5. The semiconductor memory device according to claim 4, wherein
the soft program sequence includes: a program operation for programming the memory cells with a first program voltage Vspgm1 applied to them and the dummy cells with a second program voltage Vspgm2 (>Vspgm1); and a verify operation for verifying the program states of the memory cells and dummy cells by detecting a bit line voltage under the condition that the memory cells are applied with a first verify voltage Vspv1 and the dummy cells are applied with a second verify voltage Vspv2 (>Vspv1).

6. The semiconductor memory device according to claim 1, wherein
the NAND cell units are arranged with a design rule of 60 nm or less.

7. The semiconductor memory device according to claim 1, wherein
the memory cell stores multi-level data.

8. The semiconductor memory device according to claim 1, wherein
the dummy cells are not used for storing data and not accessible.

9. A method for controlling a semiconductor memory device with a NAND cell unit having dummy cells disposed between serially-connected memory cells and select gate transistors on the both ends of the NAND cell unit, comprising:
erasing the memory cells and the dummy cells in the NAND cell unit prior to data programming;
soft programming the memory cells and the dummy cells to set them in such an erase state that an over-erase state has been dissolved; and
programming the dummy cells to set them in a state with a threshold voltage higher than that of the erase state of the memory cells.

10. The method according to claim 9, wherein
the soft programming for the memory cells and dummy cells comprises: programming the memory cells and dummy cells with a program voltage Vspgm applied to them; and verifying the program state by detecting a bit line voltage under the condition that the memory cells and dummy cells are applied with a verify voltage, and wherein
the programming for the dummy cells comprises: programming the dummy cells with a program voltage Vpgm applied to them and with a program pass voltage applied to the memory cells; and verifying the program state of the dummy cells by detecting a bit line voltage under the condition that the dummy cells are applied with a verify voltage and the other memory cells are applied with a read pass voltage.

11. The method according to claim 9, wherein
the NAND cell units are arranged with a design rule of 60 nm or less.

12. The method according to claim 9, wherein
the memory cell stores multi-level data.

13. The method according to claim 9, wherein
the dummy cells are not used for storing data and not accessible.

14. A method for controlling a semiconductor memory device with a NAND cell unit having dummy cells disposed between serially-connected memory cells and select gate transistors on the both ends of the NAND cell unit, comprising:
erasing the memory cells and the dummy cells in the NAND cell unit prior to data programming; and
soft programming the memory cells and dummy cells to dissolve an over-erase state, and to set the memory cells to be in an erase state with a first threshold voltage and the dummy cells to be in a state with a second threshold voltage higher than the first threshold voltage.

15. The method according to claim 14, wherein
the soft programming for the memory cells and dummy cells comprises: programming the memory cells with a first program voltage Vspgm1 applied to them and the dummy cells with a second program voltage Vspgm2 (>Vspgm1) applied to them; and verifying the program states of the memory cells and dummy cells by detecting a bit line voltage under the condition that the memory cells are applied with a first verify voltage Vspv1 and the dummy cells are applied with a second verify voltage Vspv2 (>Vspv1).

16. The method according to claim 14, wherein
the NAND cell units are arranged with a design rule of 60 nm or less.

17. The method according to claim 14, wherein
the memory cell stores multi-level data.

18. The method according to claim 14, wherein
the dummy cells are not used for storing data and not accessible.

* * * * *